INVENTORS
Vlastimil Bezouška, Josef Škvor, František Pajíšek, Zdeněk Zavázal, Oldřich Pokorný
By Richard Low Agt INVENTORS
Vlastimil Bezouška, Josef Škvor, František Pajíšek, Zdeněk Zavázal, Oldřich Pokorný
By [signature] Ag't INVENTORS
Vlastimil Bezouška, Josef Škvor, František
Pajíšek, Zdeněk Zavázal, Oldřich Pokorný
By Richard Low atty.

United States Patent Office 3,435,304

Patented Mar. 25, 1969

3,435,304

SEMICONDUCTOR ASSEMBLY WITH SEMICONDUCTOR ELEMENT IN AREA CONTACT UNDER PRESSURE WITH CONDUCTIVE TERMINAL ELEMENTS

Vlastimil Bezouška Pruhonice, Josef Skvor, Uvaly, and Frantisek Pajisek, Zdenek Zavazal, and Oldrich Pokorny, Prague, Czechoslovakia, assignors to CKD Praha, oborovy podnik, Prague, Czechoslovakia Filed Dec. 20, 1965, Ser. No. 515,123
Claims priority, application Czechoslovakia, Dec. 22, 1964, 7,263/64
Int. Cl. H01l 3/00, 5/00
U.S. Cl. 317—234 6 Claims

ABSTRACT OF THE DISCLOSURE

In semiconductor assemblies, a plate-shaped semiconductor element is interposed between contact faces of two contact elements and is held in contact with said contact faces by compression spring means with a precisely determined contact pressure. One of the contact elements is movable in relation to the other contact element, and the compression spring means act upon the movable contact element.

This invention relates to semiconductor assemblies, and particularly to a device in which a wafer- or plate-shaped semiconductor element is held in contact with conductive terminal elements by the pressure of a compression spring, and to a method of assembling the afore-mentioned element.

Junction diodes employed in power rectifiers may be held in current and heat-transmitting contact with associated terminals by compression springs. The performance and useful life of such an assembly depend to a very significant extent on the proper selection and maintenance of the constant pressure between the several elements. The spring force required for producing the contact pressure is of the order of several hundred kilograms in commercial diode assemblies. Only a spring having a very steep characteristic can produce such a force in the limited space available for the spring in the assembly, and it has been difficult heretofore to provide precise spacing for the abutments between which the spring is retained to produce a precisely determined stress in the spring, and a corresponding contact pressure.

An object of the invention is the provision of a semiconductor assembly of the type described which can readily be mass-produced to precisely predetermined contact pressure between the semi-conductor and the associated terminal elements.

Another object is a method of producing such an assembly.

With these and other objects in view, as will hereinafter become apparent, the invention in one of its aspects resides in a semiconductor assembly in which a plate-shaped semi-conductor member is interposed between respective parallel contact faces of two contact elements of which one will be referred to hereinafter as the "base member" for convenience of reference. Means attached to the base member are provided for urging the other contact element toward the semiconductor member with a precisely determined contact pressure.

The pressure arrangement includes a compression spring which is pre-stressed in the direction of an axis which is perpendicular to the afore-mentioned contact faces and to the corresponding faces of the semiconductor member. One end of the spring is in pressure-transmitting engagement with the semiconductor member, for example, through an insulating washer. A spring housing which substantially encloses the spring, the other contact element, and the semiconductor member consists of two housing members respectively fastened to the base member and engaging the other end portion of the spring.

One of the housing members is recessed, several recess portions being circumferentially spaced about the aforementioned axis and having each a radial plane of symmetry. The several recess portions are open in a radial direction. Projecting elements on the other spring housing member engage the recesses to prevent relative axial movement of the housing members.

In assembling the device briefly described above, the semiconductor member is interposed between the two contact elements, a first housing member is fixedly fastened to one of the contact elements, and the other housing member is slidably assembled with the first-mentioned housing member for relative movement in an axial direction. The compression spring is axially interposed between the other contact element and the second housing member, and the latter is moved axially toward the first contact element or base member until the compression spring is stressed to a predetermined value corresponding to the desired contact pressure on the faces of the semiconductor member, and until respective parts of the two housing members are axially coextensive and radially offset relative to each other with respect to the aforementioned axis.

Circumferentially spaced portions of the radially outer one of the coextensive parts of the housing members are then displaced toward the axis until the displaced portions engage corresponding recesses in the radially inner housing member, whereby forces are transmitted between the two housing members. It is an essential feature of this invention that these forces be distributed over the housing members in such a manner that the resultant axial component of the forces transmitted to each housing member be practically zero. The stress-setting of the compression spring achieved by the relative axial movement of the housing members is thus not disturbed when their axial position is fixed by the engagement of displaced portions of one housing member with recesses of the other member.

Other features and many of the attendant advantages of this invention will readily be appreciated from the following detailed description when considered in connection with the accompanying drawings, in which.

Figure 1:
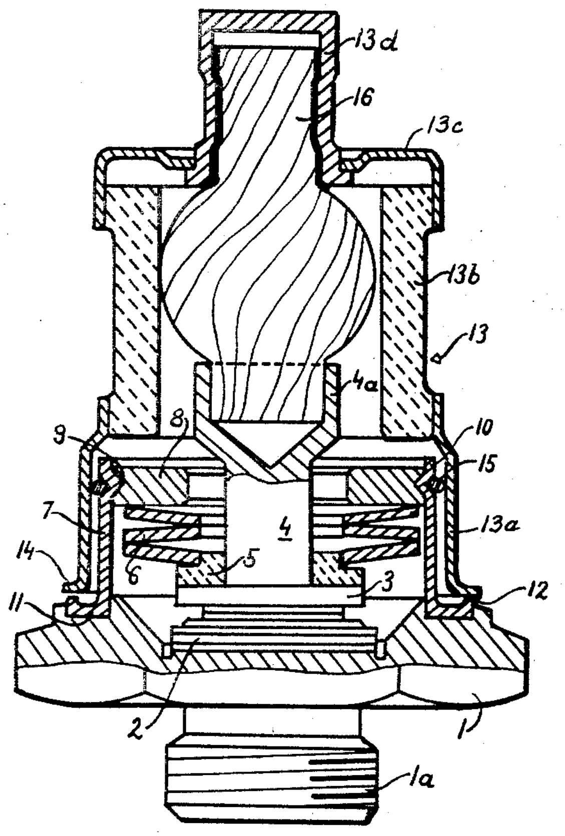
FIG. 1 shows a semi-conductor assembly of the invention in elevational section on its axis of symmetry.

Referring now to the drawing in detail, and initially to FIG. 1, there is seen a power rectifier assembly whose base member 1 is approximately plate-shaped and hexagonal about the axis of symmetry of the device. A terminal 1*a* of stepped cylindrical shape is integral with the base member 1 and extends coaxially from an outer face thereof. A shallow central recess in the inner face of the base member receives a plate- or wafer-shaped semiconductor diode 2. Respective flat faces of the diode 2 and of the base member 1 are in abutting area contact. A movable contact plate 3 makes similar contact with the opposite face of the diode 2. A stud 4 is fixedly fastened to the plate 3 and extends therefrom in an axial, upward direction, as viewed in FIG. 1. The enlarged, free end 4*a* of the stud 4 is axially recessed.

A split, ceramic, shoulder washer 5 circles the stud 4 and axially abuts against the contact plate 3. It provides one axial abutment for a stiff compression spring 6 constituted by a stack of three frustoconical Belleville washers axially juxtaposed in such a manner that the smaller base and the larger base of the axially central washer abuttingly engage the corresponding bases of the two outer washers respectively. The other axial abutment of the spring 6 is formed by a heavy flat ring 8 which constitutes the centrally apertured radial end wall of a spring housing of inverted cup shape. The axial wall of the housing is formed by an approximately cylindrical sheet metal shell 7 whose free rim carries an integral flange fixedly fastened to the base member 1, brazing being the preferred fastening method. A circumferential bead 12 projects axially from the flange 11.

The ring 8 is held in a precisely determined axial position relative to the base member 1 by a circular rib 10 which projects radially inwardly from the shell 7 into a conforming groove 9 in the circumferential face of the ring 8.

The spring housing is enclosed in an outer casing 13 which consists in axial sequence, of a flanged sheet metal tube 13*a*, a cylindrical ceramic tube 13*b*, a sheet metal flange 13*c*, and a cup-shaped metal terminal 13*d* coaxially fastened to each other to form an upwardly closed sealed assembly. The flange 14 of the metal tube 13*a* is fixedly fastened to the bead 12 by arc welds, not seen in the drawing. An O-ring 15 of polytetrafluoroethylene interposed between the shell 7 and the tube 13*a* is axially secured by being partly received in a groove of the outer shell face corresponding to the rib 10 on the inner face. The O-ring 15 protects the elements within the casing 13 against atmospheric contaminants such as the welding fumes produced when the tube 13*a* is fastened to the bead 12.

A twisted, stranded copper conductor 16 has end portions respectively fastened in the axial recess of the stud portion 4*a* and in the terminal 13*d*.

Figure 2:
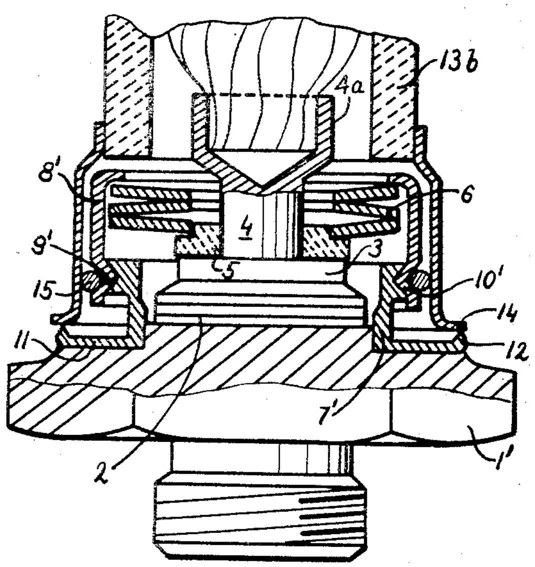
FIG. 2 shows a modified assembly in a fragmentary view corresponding to that of FIG. 1.

The assembly illustrated in FIG. 2 differs from that described above by a modified spring housing. A flat annular face of the base member 1' carries a ring 7' of approximately L-shaped cross section. A radially outer edge of the ring 7' carries the welding bead 12. An axially terminal portion of the ring 7' is enlarged and formed with a groove 9' in its radially outward face. The groove is engaged by a circular, integral rib 10' on the inner wall of a centrally apertured sheet metal cup 8' coaxial with the base member 1' and the ring 7'. A spring 6 is axially interposed between the annular bottom portion of the cup 8' and the washer 5 of the device which is otherwise substantially identical with that shown in FIG. 1.

In making the semi-conductor device shown in FIG. 1, the flange 11 of the shell 7 is brazed to the base member 1. The semiconductor element 2 and the contact plate 3 with its stud 4 are next positioned as shown in FIG. 1, and the several portions of the split ceramic washer are put on the plate 3 about the stud 4. The openings of the several Belleville washers which jointly constitute the spring 6 are of sufficient size to pass the enlarged end 4*a* of the stud 4 in the relaxed condition of the washers, and the washers are slipped over the stud and followed by the cup or ring 8 which is provided with the groove 9 prior to assembly and is initially axially slidably received in the shell 7. The inner circumference of the lowermost Belleville washer engages the shoulder of the ceramic washer 5, and thereby holds the several parts of the washer 5 together. Axial pressure is applied next to the ring 8 to compress the spring 6, the pressure being equal to the desired contact pressure between the semiconductor element 2, the contact plate 3, and the contact face of the base member 1.

Figure 3:
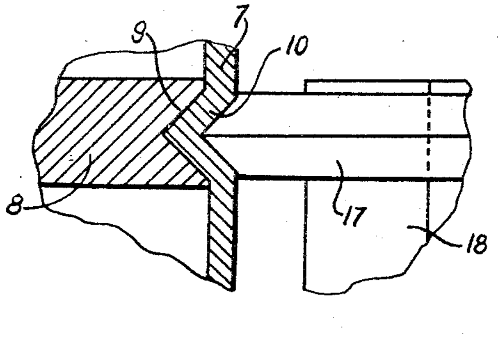
FIG. 3 illustrates the step of shaping a detail common to the devices of FIGS. 1 and 2, the device of FIG. 1 and a shaping apparatus being shown in a fragmentary view corresponding to that of FIG. 1, but on a larger scale.

FIG. 3 shows the relative axial position of the shell 7 and of the ring 8 at this stage of the assembly operation. A shaping wheel 17 mounted on a shaft 18 for rotation about the axis of the latter, parallel to the axis of symmetry of the semiconductor assembly is moved radially toward the outer face of the shell 7 while the semi-conductor assembly is rotated about its axis.

As shown in FIG. 3, the groove 9 is V-shaped in cross section, and its two obliquely inclined walls are symmetrical with respect to a radial plane through the bottom of the groove. The shaping face of the wheel 17 is similarly symmetrical and conforms to the shape of the groove 9. When the wheel 17 is moved radially toward the shell 7 while the shell rotates about its axis to form therein the internal rib 10 and the corresponding outer groove, the resultant of the forces exerted on the ring 8 by the wheel 17 has no axial component that could further compress the spring 6 or permit its expansion before the ring 8 is fixedly secured in the desired position.

The further assembly of the conductor 16 with the terminal 13*d* and the stud 4, the insertion of the O-ring 15 in the external groove of the shell 7, the arc-welding of the flanged metal tube 13*a* to the bead 12, and the installation of the ceramic tube 13*b* and flange 13*c* follow in an obvious manner, and do not require more detailed description.

The assembly of the device shown in FIG. 2 is performed in an analogous manner, the internal rib 10' in a portion of the sheet metal cup 8' being axially coextensive with the groove 9' in the ring 7' and being shaped in the manner shown in FIG. 3.

Figure 4:
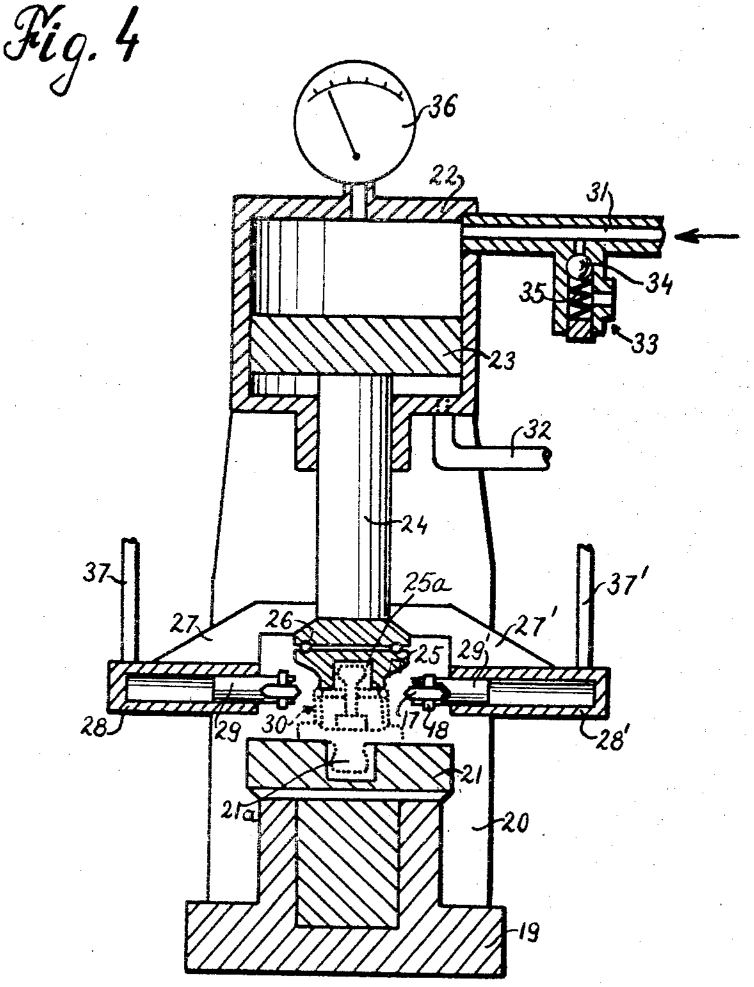
FIG. 4 shows the shaping apparatus on a smaller scale and in elevational section.

Preferred apparatus for forming the ribs 10, 10' and for thereby establishing the stress in the spring 6 is shown in FIG. 4. The heavy base 19 of an upright column 20 has an upwardly open cylindrical recess in which a heavy turntable 21 is journaled. A hydraulic cylinder 22 coaxial with the turntable 21 is mounted on the top of the column 20 and contains a piston 23 whose rod 24 extends towards the turntable. An anvil 25 is attached to the free end of the piston rod 24 by a ball bearing 26 and by axial fastenings, not shown.

Two heavy brackets 27, 27' mounted on the piston rod 24 support two hydraulic cylinders 28, 28' of noncircular cross section in which plungers 29, 29' are horizontally slidable. The forked free ends of the plungers which face each other adjacent the axis of the turntable 21 carry shaping wheels 17 on shafts 18.

The turntable 21 and the anvil 25 have opposite radial faces formed with respective central recesses 21*a*, 25*a* for respectively receiving the free stud end 4*a* and the terminal 1*a* of the semiconductor assembly of FIG. 1, which are shown in FIG. 4 in phantom view and indicated jointly with other elements of the assembly by numeral 30. The recess 25*a* is so dimensioned that the remaining annular portion of the anvil face can enter the shell 7 for abutting engagement with the ring 8 and for compressing the spring 6, the details of the semiconductor assembly 30 not being shown in FIG. 4.

The apparatus further includes a hydraulic system for actuating the several hydraulic cylinders, only partly shown in the drawing, since it may otherwise be conventional. A conduit 31 connects the upper compartment of the cylinder 22 to a non-illustrated control valve and pump while another conduit 32 connects the lower compartment to a non-illustrated sump through the same control valve, and vice versa. A safety valve 33 having a valve ball 34 biased toward the closed position by a calibrated spring 35 vents the conduit 31 to the non-illustrated sump when the pressure in the conduit exceeds the value set by the spring 35, and indicated by a gage 36 on the cylinder 22. Conduits 37, 37' connect the cylinders 28, 28' to the hydraulic system through a common, non-illustrated control valve.

In operating the apparatus shown in FIG. 4, the upper compartment of the cylinder 22 is first vented and hydraulic fluid is admitted to the lower compartment through the conduit 32 to raise the piston 23 and the anvil 25. The conduits 37, 37' are connected to the sump so that the plungers 29, 29' may be retracted manually.

The partly assembled semi-conductor device of FIG. 1 may then be placed on the top face of the turntable 21 in such a manner that the terminal 1*a* is received in the recess 21*a*, and is thereby centered. It will be understood that the semi-conductor wafer or plate 2, the contact plate 3, the stud 4, and the ceramic washer 5 are in their operative positions on the base member 1, and that the spring 6 is installed, but yet relaxed and provided with the ring 8 in which the groove 9 was formed before installation. The sheet metal shell 7 is fixedly fastened to the base member 1, but still lacks the rib 10 and the corresponding outer groove.

When pressure fluid is next admitted to the upper compartment of the cylinder 22 until the safety valve 33 is opened, the anvil 25 compresses the spring 6 to a stress uniquely determined by the characteristics of the calibrated spring 35. Frictional effects may be disregarded at the pressure normally employed. The circular shaping edges of the wheels 17 move axially with the piston rod 24, the anvil 25 and the ring 8 while the spring 6 is being compressed, and thus remain aligned with the groove 9 in the ring 8 if the dimensions of the apparatus and the ring are properly selected. Manufacturing tolerances in elements of the semi-conductor assembly other than the ring 8 do not affect the precision of this alignment.

When the spring 6 has been suitably pre-stressed, pressure fluid is admitted to the cylinders 28, 28' while the turntable 21 is being slowly rotated by hand or by a non-illustrated motor drive. The wheels 17 engage the outer face of the shell 7, as described above, and the rib 10 is formed. Because of the absence of unbalanced axial stresses in the ring 8 during the formation of the rib 10, the proper relative position of the sleeve 7, of the ring 8, and of the wheels 17 is precisely maintained during the rolling operation. The contact pressure between the semiconductor element 2 and the cooperating contact faces of the base member 1 and of the contact plate 3 is precisely established and independent of manufacturing tolerances in the various elements of the semiconductor assembly other than the ring 8 which is easily and inexpensively manufactured with great precision on a simple lathe.

If the apparatus illustrated in FIG. 4 is to be employed for assembling the modified device shown in FIG. 2, the position of the wheels 17 may have to be adjusted in an obvious manner without otherwise changing the operation of the apparatus. The prestress in the spring 6 may be varied by replacing the spring 35 by a stronger or weaker spring.

Many variations and modifications of the several embodiments of the invention described hereinabove and illustrated in the drawing will readily suggest themselves to those skilled in the art. The use of pressure springs instead of hydraulic cylinders in the apparatus of FIG. 4 is specifically contemplated.

While a rib 10, 10' conforming to the groove 9, 9' is preferred, at least some of the advantages of the invention can be achieved by forming projections on the shell 7 or the cup 8' which are not annular, but are spaced about the axis of the semiconductor assembly. Such projections may be formed on the apparatus of FIG. 4 without any structural changes, but shaping tools other than the wheels 17 are obviously suitable for the same purpose. It will also be appreciated that semiconductor devices having more than two external contacts may be partly assembled by the method of the invention using apparatus analogous to that shown in FIG. 4.

The insulating washer 5 and the insulating tube 13*b* may be made of materials other than ceramics and the manner in which the two electrodes of the diode 2 are insulated from each other is capable of many variations obvious to those skilled in the art. The specifically disclosed arrangement, however, is preferred because of its simplicity and reliability.

It should therefore be understood that the foregoing disclosure relates only to preferred embodiments of the invention, and that it is intended to cover all changes and modifications of the examples of the invention herein chosen for the purpose of the disclosure which do not constitute departures from the spirit and scope of the invention set forth in the appended claims.

What is claimed is:

1. A semiconductor assembly comprising, in combination:

(a) fixed contact means including a base member;

(b) movable contact means including a contact member, said fixed and movable contact means having respective opposite contact faces extending in a common direction;

(c) a plate-shaped semiconductor member interposed between said faces in electrical contact therewith; and (d) pressure means attached to said base member for urging said contact member toward said semiconductor member, said pressure means including (1) a compression spring prestressed in a direction transverse of said common direction and having two end portions spaced in said transverse direction, one of said end portions being in pressure-transmitting engagement with said contact member;

(2) a first spring housing member fixedly fastened to said base member, and (3) a second spring housing member in pressure transmitting engagement with the other end portion of said spring, one of said spring housing members being formed with recess means having a plurality of portions circumferentially spaced about an axis extending in said transverse direction, the portions each having a plane of symmetry extending in said common direction and being open in said direction and projection means on the other spring housing member engaging said recess means for preventing relative axial movement of the spring housing members, said recess means constituting an annular groove about said axis, said projection means including an annular rib conformingly engaging said groove, the groove being open in a radially outward direction relative to said axis, said other spring housing member being of sheet material of substantially uniform thickness and being formed with an annular groove open in a radially outward direction and radially aligned with said rib.

2. An assembly as set forth in claim 1, wherein said housing members jointly constitute a cup-shaped housing substantially enclosing said contact member, said semiconductor member, and said spring, said one housing member being a centrally apertured disc forming the bottom of the cup-shape and having a circumferential face formed with said groove therein, said other end portion of the spring abuttingly engaging said disc.

3. An assembly as set forth in claim 1, wherein said housing members jointly constitute a cup-shaped housing substantially enclosing said contact member, said semiconductor member, and said spring, said one housing member being said first housing member.

4. An assembly as set forth in claim 1, further comprising a radial flange on said first housing member, said base member having a flat radial face abuttingly engaging said flange.

5. An assembly as set forth in claim 1, further comprising a radially extending flange on said first housing member and an outer casing extending about said axis and a weld fixedly fastening said outer casing to said flange, said outer casing substantially enveloping said spring housing members.

6. An assembly as set forth in claim 1, further comprising an annular sealing member partly received in the groove of said other spring housing member, the sealing member abuttingly and sealingly engaging said other spring housing member and said outer casing in a closed loop about said axis.

References Cited

UNITED STATES PATENTS

| | | | |
|---|---|---|---|
| 3,105,926 | 10/1963 | Herlet | 317—234 |
| 3,160,800 | 12/1964 | Smart | 317—234 |
| 3,192,454 | 6/1965 | Rosenheinrich et al. | 317—234 |
| 3,252,060 | 5/1966 | Marino et al. | 317—234 |
| 3,294,895 | 12/1966 | Reintgen et al. | 317—234 |
| 3,296,506 | 1/1967 | Steinmetz et al. | 317—234 |

JAMES D. KALLAN, *Primary Examiner.*

U.S. Cl. X.R.

29—589